(12) United States Patent
Chakravorty

(10) Patent No.: US 7,112,285 B2
(45) Date of Patent: Sep. 26, 2006

(54) CONDUCTIVE CORE SUBSTRATE FABRICATION

(75) Inventor: Kishore K. Chakravorty, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 10/313,935

(22) Filed: Dec. 5, 2002

(65) Prior Publication Data

US 2004/0110382 A1    Jun. 10, 2004

(51) Int. Cl.
*H01B 13/00* (2006.01)

(52) U.S. Cl. .................. 216/18; 216/19; 438/129; 438/667

(58) Field of Classification Search ............. 438/121, 438/127, 129, 667, 668; 216/18, 19
See application file for complete search history.

(56) References Cited

U.S. PATENT DOCUMENTS 5,229,550 A * 7/1993 Bindra et al. ............... 174/262
5,876,842 A * 3/1999 Duffy et al. ................. 428/209
6,492,201 B1 * 12/2002 Haba ........................... 438/121
6,496,356 B1 * 12/2002 Japp et al. ................. 361/306.3

* cited by examiner

*Primary Examiner*—Lan Vinh
(74) *Attorney, Agent, or Firm*—Charles A. Burrell

(57) ABSTRACT

Methods are provided for fabricating plated through hole conductive core substrate which eliminate the secondary step of producing a through hole in the dielectric material plugging the core through hole. In one embodiment of the method in accordance with the invention, a two-step lamination process is provided. One side of the conductive core is provided with a dielectric laminate, a portion of which flows into and coats the core through hole wall. Excess dielectric material flows out of the core through hole preventing plugging. Similarly, the other side of the conductive core is provided with a dielectric laminate, a portion of which flows into the core through hole completing the coating of the core through hole wall forming a dielectric liner. The dielectric liner insulates the conductive core through hole wall from a conductive layer deposited onto the dielectric liner forming a plated through hole.

11 Claims, 5 Drawing Sheets

CONDUCTIVE CORE SUBSTRATE FABRICATION

FIELD OF THE INVENTION

The present invention relates to conductive core substrate fabrication, and, more particularly, to methods for fabricating plated through hole conductive core substrates.

BACKGROUND OF INVENTION

Conductive core substrates used for printed circuits have dielectric layers which electrically insulates individual printed circuit conductors from a central conductive core. Among the advantages of such conductive core substrates are temperature equalization, ground plane shielding, dimensional stability, elimination of warp, and high structural strength. Conductive core substrates have been used wherein the conductive core is used to transfer heat out of an electronic package or as part of the electrical circuit, such as to carry ground voltage. The conductive core is also used to control in-plane expansion that is necessary for the surface mounting of leadless microelectronic packages.

The construction of conductive core substrates is rather difficult, especially when plated through holes (PTH) are required in order to connect both sides of the conductive core substrate electrically, such as in the case of a via-in-via conductive core substrate. A plated through hole is a through hole wherein the through hole wall has a coating or lining of conductive material. The conductive lining electrically bridges conductors on one side of the through hole with conductors on the other side the through hole. The PTH's must be electrically isolated from the conductive core to prevent shorting, which complicates manufacturing. Therefore, such conductive core substrates are not widely used and are now substituted by more expensive solutions.

FIG. 1 is a flow diagram illustrating one of the current methods used to fabricate a conductive core substrate. The method comprises providing a conductive core in the form of a thin sheet of conductive material 102. The conductive core is provided with one or more core through holes (CTH) 104, such as in a process using mechanical drilling, chemical etching, laser drilling, or punching. Dielectric material is laminated on both sides of the conductive core 106. The dielectric material consists of sheets of epoxy prepreg material, which, during the curing step, the epoxy resin flows to completely fill the CTH's forming dielectric plugs therein 108. A secondary mechanical process is used to provide a dielectric through hole (DTH) centered on the dielectric plug in the CTH 110. The DTH is smaller in diameter than the CTH, which leaves a layer of the dielectric material lining the CTH wall. Electroless copper (Cu) is deposited on the now dielectric-covered conductive core, including the DTH walls 112, followed by a heavier electroplating of Cu 114. This produces a plated through hole (PTH) that is electrically isolated from the conductive core by the layer of dielectric material lining the CTH. The electrical circuit is then fabricated on the conductive layer on each side by conventional processing.

The drilling of the conductive core and the dielectric plugs to produce CTH's and DTH's, respectively, is commonly done using a laser. Mechanical drilling is not suitable for producing through holes smaller than about 150 μm. Mechanical drilling is thus appropriate only for large-diameter through holes and larger pitches (spacing between through holes).

Current manufacturing yields for conductive core substrates are poor. Also, the costs associated with double drilling, and the problems associated with maintaining tolerances during the double drilling steps, are high. Therefore, conductive core substrates have not found wide acceptance in industry, but have been used for critical applications such as for temperature equalization in avionics where conventional cooling systems are too bulky and ineffective.

For example, to produce a PTH with a finished diameter of 1 mm, a 1.15 mm diameter DTH must be drilled in the dielectric plug to allow for copper plating to a minimum thickness of 0.05 mm on the DTH wall. Also, the dielectric layer on the CTH wall must have a minimum thickness of 0.25 mm to prevent the dielectric plug from being torn out of the CTH during the second drilling operation. In addition, allowance must be made for cumulative registration errors in the first and second drilling operations by adding another 0.08 to 0.13 mm to the diameter of the CTH. Thus, to produce a finished PTH with a diameter of 1 mm, the CTH must be drilled to a diameter of 1.73 mm to 1.78 mm. When CTH's are drilled on 2.54 mm centers, the double drilling operation leaves a web of core material between adjacent CTH's having a width of 0.76 mm to 0.81 mm. The CTH to CTH distance cannot be made smaller than 2.54 mm because the first CTH must be so much larger than the PTH. This makes it difficult to increase the component packaging density.

A method is needed to address the problem of the high cost associated with the secondary step of laser drilling of the dielectric plugs in the CTH's. This step is a time-consuming process requiring 15–20 laser pulses per CTH. This step accounts for an estimated 5–7% of the total substrate cost. The method needs to address the alignment issues associated with laser drilling the CTH's and DTH's. Alignment issues require that the CTH's and DTH's be sized larger and spaced further apart than one would need for a more accurate process. Further, issues of scalability and migration to finer PTH pitches, which are limited by current methods, needs to be addressed. Additionally, the method should be applicable to electrically conductive organic core material, such as resin/graphite based materials.

For the reasons stated above, and for other reasons stated below which will become apparent to those skilled in the art upon reading and understanding the present specification, there is a significant need in the art for methods that address these issues.

DESCRIPTION

Figure 1:
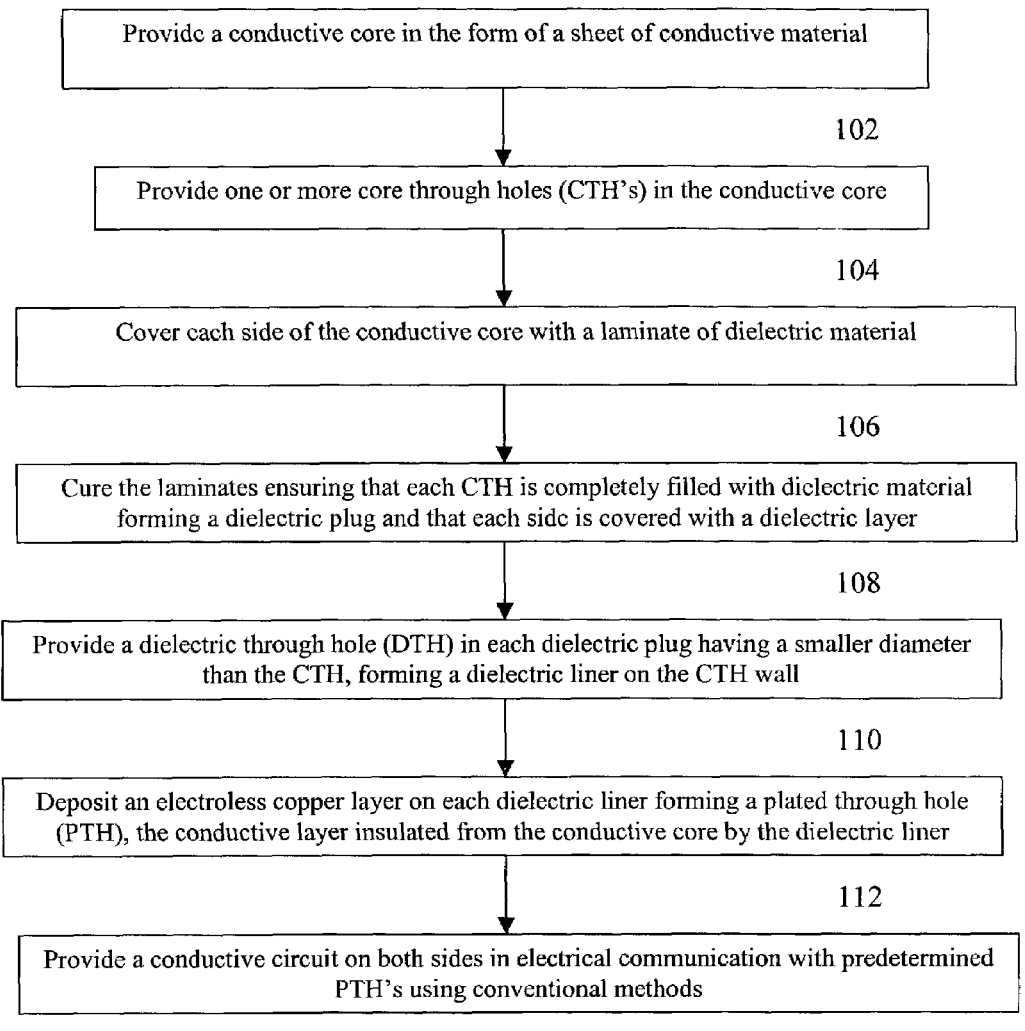
FIG. 1 is a flow diagram illustrating a current method used to fabricate a conductive core substrate.
Figure 2:
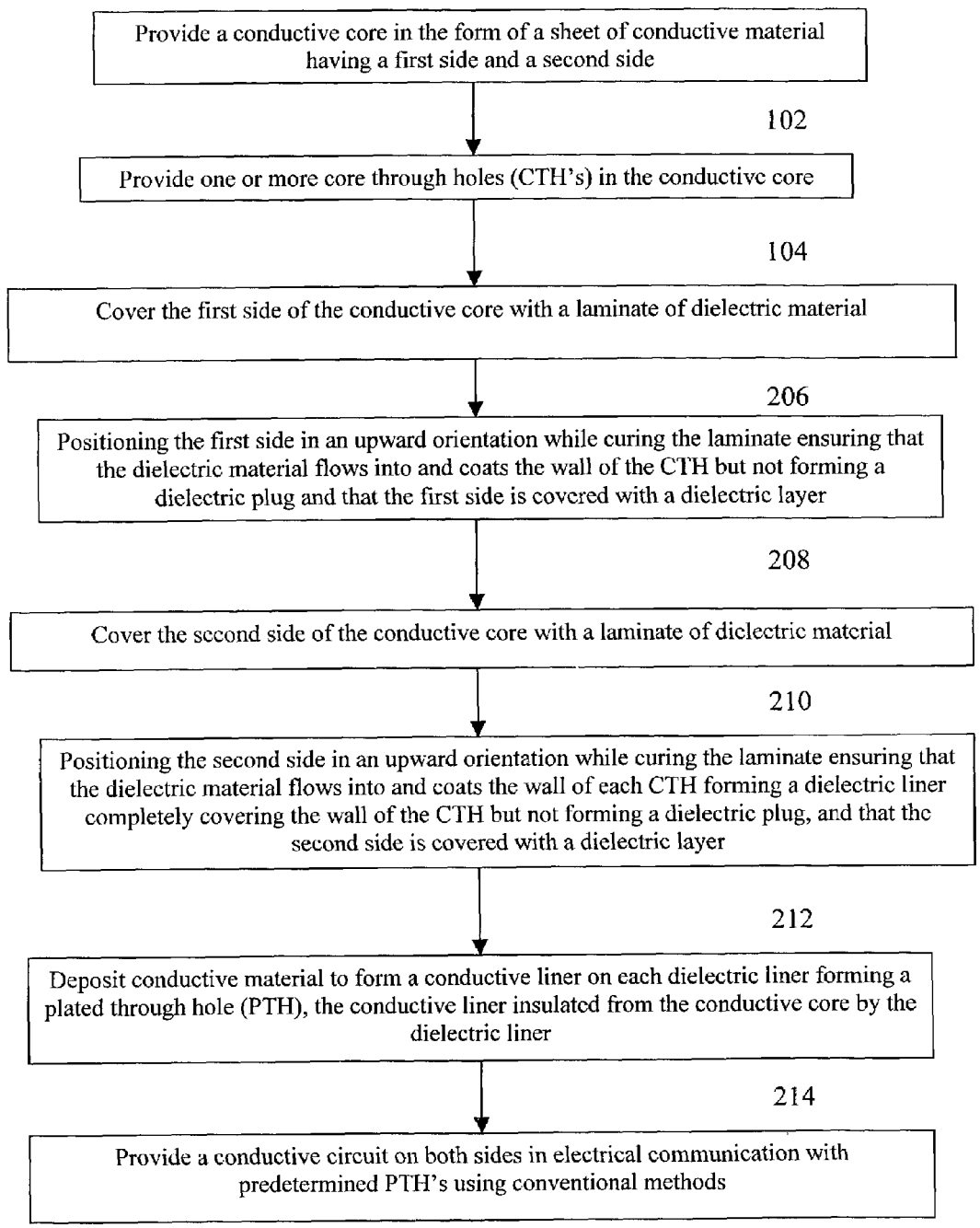
FIG. 2 is a flow diagram of an embodiment of a method for fabricating a conductive core substrate in accordance with the present invention.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention.

The present invention provides methods for the fabrication of conductive core substrates that eliminate the secondary step of forming a dielectric through hole (DTH) in a solid dielectric plug in the core through hole (CTH). This greatly simplifies the current via-in-via (VIV) conductive core substrate fabrication process. In the following description, numerous specific details are set forth in order to provide a thorough understanding of the present invention. It will be obvious, however, to one skilled in the art that the present invention can be practiced without these specific details. In other instances, some details have been omitted in order to avoid obscuring the present invention.

FIGS. 2 and 3A–E include a flow diagram and cross-sectional views, respectively, illustrating an embodiment of a method for fabricating a conductive core substrate 320 in accordance with the present invention. A two-stage lamination process is used to deposit dielectric material on a conductive core 302, 102. The dielectric material electrically insulates the conductive core 302 from subsequent conductive layers making up the conductive core substrate 320.

The conductive core 302 is a sheet of conductive material provided with a predetermined quantity of core through holes 306 (CTH's) 104. A core first side 303 of the conductive core 302 is covered with a laminate 311a of dielectric material 206. The conductive core 302 is positioned such that the core first side 303 is in an upward orientation. At elevated temperature, the laminate 311a undergoes a curing process in which a portion of the dielectric material flows into each CTH 306, uniformly covering the CTH wall 308. Each CTH 306 remains open for the excess dielectric material to flow through the CTH 306 and out of the core second side 304 without forming a dielectric plug within the CTH 306,208.

The core second side 304 undergoes a similar process to create a symmetric dielectric layer 310. The core second side 304 of the conductive core 302 is covered with a laminate 311b of dielectric material 210. The conductive core 302 is positioned such that the core second side 304 is in an upward orientation. At elevated temperature, the laminate 311b undergoes a curing process in which a portion of the dielectric material flows into each CTH 306, uniformly covering the CTH wall 308 and the previously applied dielectric material forming a dielectric liner 312. Each CTH 306 remains open for the excess dielectric material to flow through the CTH 306 and out of the core first side 303 without forming a dielectric plug within the CTH 306, 212.

This method results in the conductive core 302 having a uniform dielectric layer 310 on the core first and second sides 303,304 and a dielectric liner 312 on each CTH wall 308 forming a dielectric through hole 314 (DTH). The terms "dielectric layer" 310 and "dielectric liner" 312 are used for convenience to identify the location on the conductive core 302 where the dielectric material has been deposited.

The dielectric material suitable for use as laminates for the dielectric layer 310 and dielectric liner 312 in accordance with the present invention includes, but is not limited to, thermoset plastic, epoxy, and ABF plastic, which flow freely at elevated temperatures.

After the dielectric material is deposited on the conductive core 302, an electrically conductive material is deposited at predetermined locations on the dielectric material using processes known in the art. The electrically conductive material is deposited on each dielectric liner 312 to form a conductive liner 319 that defines a plated through hole 318 (PTH). The conductive liner 319 is electrically insulated from the CTH wall 308 by the dielectric liner 312, 214. The electrically conductive material is deposited at predetermined locations on the dielectric layer 310 to form a conductive layer 316 on the core first and second sides 303,304 and in electrical communication with predetermined conductive liners 319, 216. The terms "conductive layer" 316 and "conductive liner" 319 are used for convenience to identify the location on the dielectric material-covered conductive core 302 where conductive material has been deposited. They comprise the same conductive material and may be deposited individually or simultaneously.

FIGS. 4, 3A, 5A and 5B include a flow diagram and cross-sectional views, respectively, illustrating an embodiment of a method in accordance with the present invention for producing a conductive core substrate 320 comprising depositing dielectric material onto the conductive core using an electrophoretic deposition process. An electrophoretic deposition process is a method of organic finishing which uses an electric current field to deposit organic material onto a substrate material. An electrophoretic deposition process suitable for the particular purpose is presented in United States Patent Application 20020105774, Wermer, et al., filed Dec. 8, 2002.

A conductive core 302, in the form of a conductive sheet, is provided with a predetermined quantity of CTH's 306, 102,104. An electrophoretic deposition process is used to deposit dielectric material onto the conductive core 302 by immersion in a resin dispersion, such as, but not limited to a polymer film, in accordance with known processes. The electrophoretic deposition process completely and uniformly coats each CTH wall 308 without forming a dielectric plug within the CTH 306. The core first and second sides 303,304 are provided with a dielectric layer 310 and each CTH wall 308 is provided with a dielectric liner 312, 406. An electrophoretic coating is particularly advantageous as the process deposits the dielectric material on all exposed surfaces of the conductive core 302 in a single process.

The resins used for the electrophoretically deposited dielectric layer 310 and dielectric liner 312 must have good electrical insulating properties and sufficient thermal stability to withstand the soldering temperatures to which the conductive core substrates 320 are subjected. Solder processing temperatures of 288.degree.C. are common, but in some manually soldered operations, soldering temperatures may reach 425.degree.C. for a short time at the contact point of the soldering iron. In addition to having good electrical insulating and thermal properties, the resins used must be able to achieve a polar surface suitable for accepting a conductive layer, i.e., it should be adhesion promotable. Suitable resins include, but are not limited to, thermosetting resins such as acrylics, alkyds, epoxies, epoxy-acrylates, polyesters, polyamide-imides, polyimides and mixtures thereof, and thermoplastic resins such as acrylates, polysulfones, polyetherether ketones, or other engineering grade thermoplastics, and mixtures of the foregoing resins.

After the dielectric material is deposited on the conductive core 302, an electrically conductive material is deposited at predetermined locations on the dielectric material using processes known in the art. The electrically conductive material is deposited on each dielectric liner 312 to form a conductive liner 319 that defines a PTH 318, 408. The conductive liner 319 is electrically insulated from the CTH wall 308 by the dielectric liner 312, 214. The electrophoretically deposited dielectric liner 312 on the CTH walls 308 must be thick enough to provide adequate electrical insulation between the conductive liner 319 of each PTH 318 and the CTH wall 308. The electrically conductive material is deposited at predetermined locations on the dielectric layer 310 to form a conductive layer 316 on the core first and second sides 303,304 and in electrical communication with predetermined conductive liners 319, 410.

In the embodiments in accordance with the present invention, the conductive core 302 is provided in sheet form and can be of various thickness depending upon the application. Where some flexibility is required in the conductive core substrate 320, the conductive core 302 can be as thin as 0.1 mm. Where heavy components such as transformers are to be supported on the conductive core substrate 320, the conductive core 302 can be as thick as 3 mm or more. However, in most applications, the conductive core 302 will have a thickness between about 0.5 to 1.3 mm.

The choice of conductive material for the conductive core 302 also depends on the particular application. Examples of material suitable for the conductive core 302 include, but are not limited to, steel, stainless steel, aluminum, copper, and laminates of metals, such as copper Invar copper and copper tungsten copper. For applications where economics is a particular issue, steel is advantageous. For many applications where weight is an important factor, aluminum is advantageous. Aluminum has the advantage of being a better heat conductor than steel when used for heat transfer applications.

Some applications require a substrate having the same coefficient of thermal expansion as the microelectronic package that is to be coupled to the substrate. For these applications, special alloys are used, such as, but not limited to, copper clad Invar, an iron-nickel alloy containing 36% nickel (commercially available from Texas Instruments Inc., Metallurgical Div., Attleboro, Mass. 02703), and Alloy 42, an iron-nickel alloy containing 42% nickel (commercially available from Pfizer, Inc., Wallingford, Conn.).

Each CTH 306 is produced in the conductive core 302 using a number of processes, including, but not limited to, drilling, etching, and laser ablation. Since a substrate of this type can have greater than 10,000 PHT's 318 at diameters of 50 mm and lower, advanced laser drilling processes are more commonly used. Laser drilling provides a high production rate of CTH's 306 with placement accuracy of ±10 microns. These laser drilling processes also produce CTH's 306 with minimal wall taper.

In the embodiments in accordance with the present invention, the conductive layer 316 is deposited on the dielectric layers 310 to form a circuit pattern. One example of a circuit pattern comprises a series of conductive traces interconnected with other conductive traces and the plated through holes 318. These conductive traces are used for signal routing and bonding surfaces, among other. Processes for forming circuit patterns are well known in the art, including, but are not limited to, discrete wiring, and subtractive, semi-additive, additive lithographic techniques.

The conductive material deposited on the dielectric material comprises a material suitable for the particular purpose of conducting electricity and/or heat. Examples of suitable materials include, but are not limited to, copper (Cu), gold, silver, nickel and copper alloys, and chromium and copper alloys.

Processes for depositing conductive material onto dielectric material suitable to form the conductive layer 316 and conductive liner 319 are well known in the art. Examples of suitable processes to apply the conductive material include, but are not limited to, electroless and electrolytic plating, sputter coating, ion deposition, foil lamination, and combinations thereof.

Multi-layer conductive core substrates are anticipated using the methods in accordance with the present invention. Additional dielectric and conductive layers 310,316 can be built-up on the resulting conductive core substrate 320 using known processes. A dielectric layer 310 is deposited in a process using the methods described above. Holes or conduits between one or more dielectric and/or conductive layers 310,316 for producing vias to electrically link one conductive layer 316 to another, are fabricated using a process such as, but not limited to, laser ablation and UV photoexposure. Using the methods as described above, additional conductive layers 316 can be deposited onto additional dielectric layers 310.

In another embodiment in accordance with the present invention, a conductive material is deposited on the dielectric liner of the conductive core completely filling the through hole to form a conductive plug. The conductive layers are electrically coupled between the core first side and the core second side by predetermined conductive plugs. A conductive circuit is provided on the conductive layer on the core first and second sides and in electrical communication with predetermined conductive plugs, using known processes.

Figure 3A:
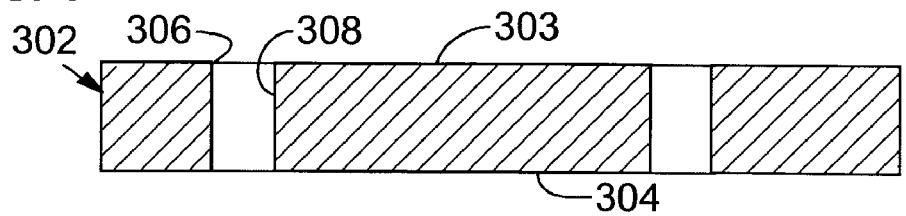
FIG. 3A is a cross-sectional view of a conductive core in the form of a conductive sheet having core through holes.
Figure 3B:
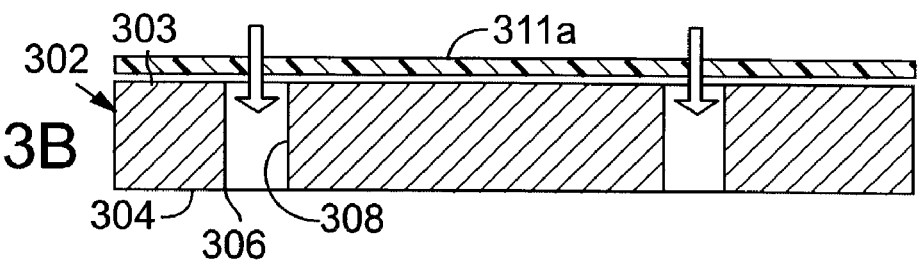
FIG. 3B is a cross-sectional view of a conductive core and a dielectric laminate on a first side, in accordance with an embodiment of a method of the present invention.
Figure 3C:
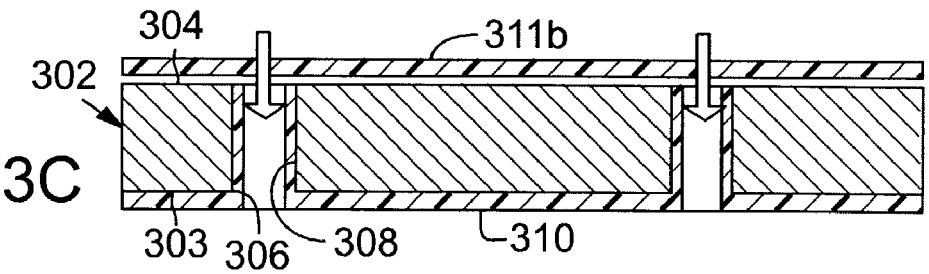
FIG. 3C is a cross-sectional view of a conductive core with a dielectric layer on a first side and a dielectric laminate on a second side, in accordance with an embodiment of a method of the present invention.
Figure 3D:
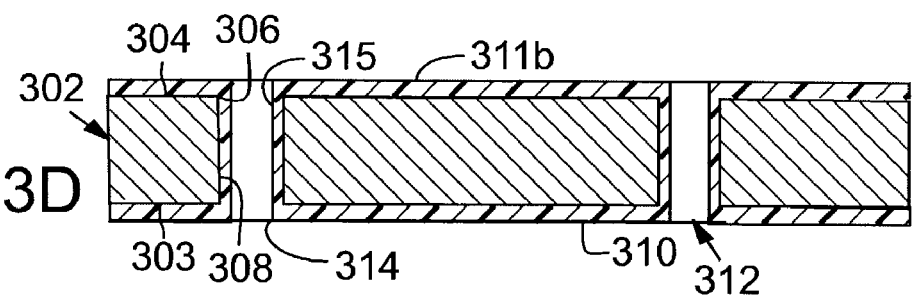
FIG. 3D is a cross-sectional view of a conductive core with a dielectric layer on the first side and the second side and a dielectric liner on the wall of each core through hole, in accordance with an embodiment of a method of the present invention.
Figure 3E:
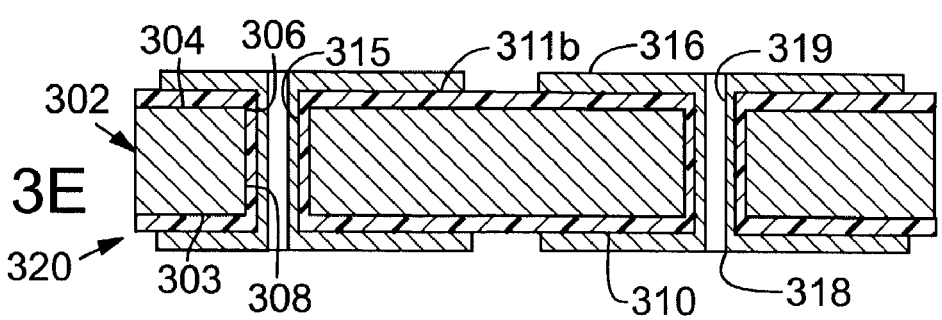
FIG. 3E is a cross-sectional view of a conductive core substrate, in accordance with an embodiment of a method of the present invention.
Figure 4:
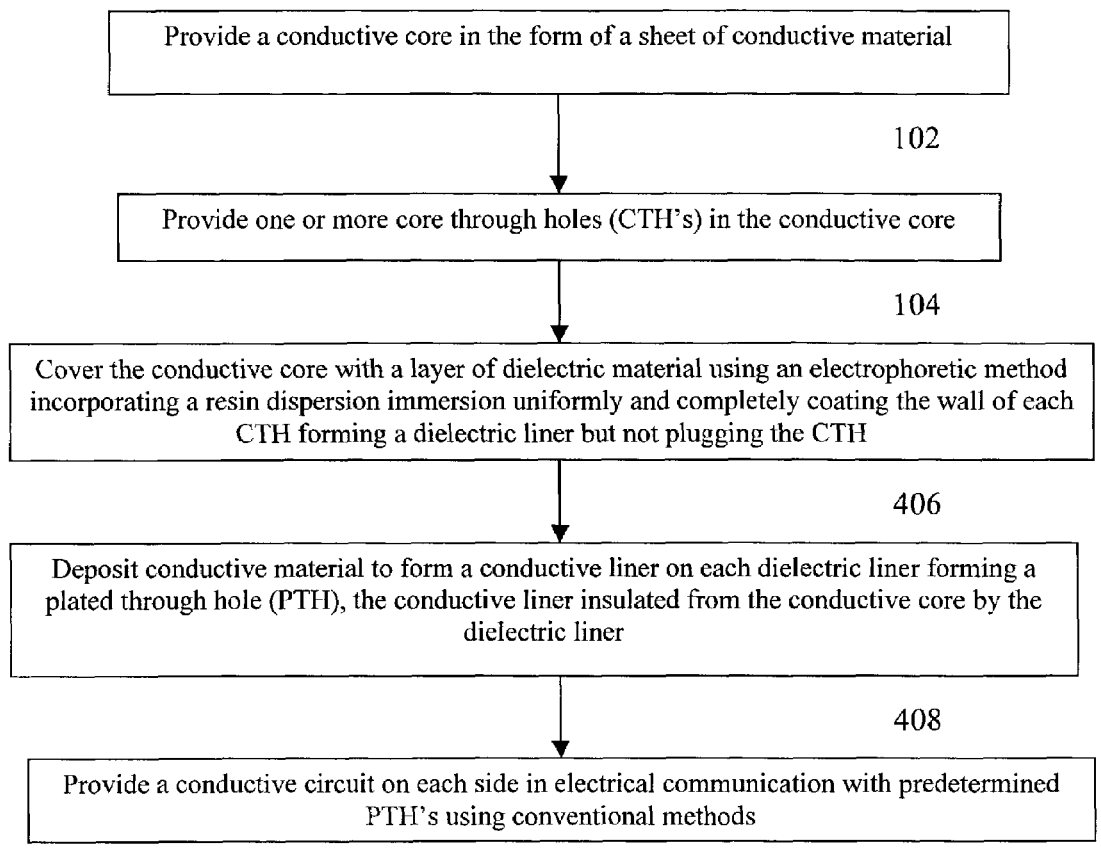
FIG. 4 is a flow diagram of an embodiment of the method including electrophoretic deposition of a dielectric layer, in accordance with the present invention.
Figure 5A:
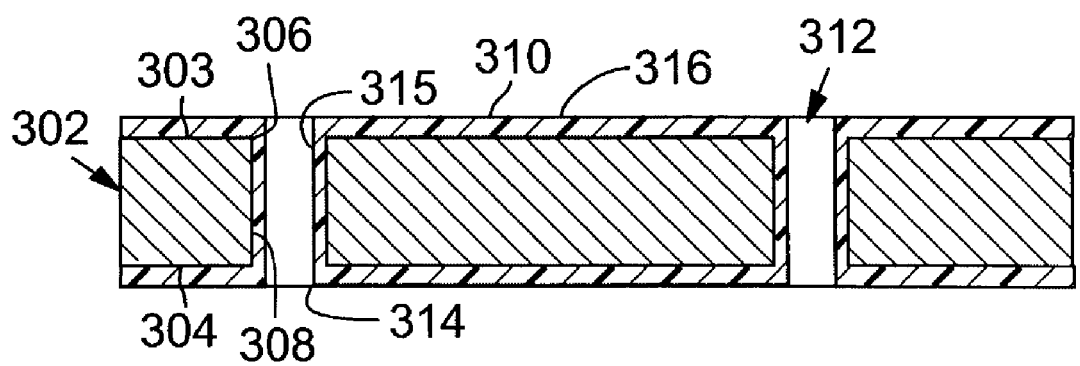
FIG. 5A is a cross-sectional view of a conductive core with an electrophoretically deposited dielectric layer, in accordance with an embodiment of a method of the present invention.
Figure 5B:
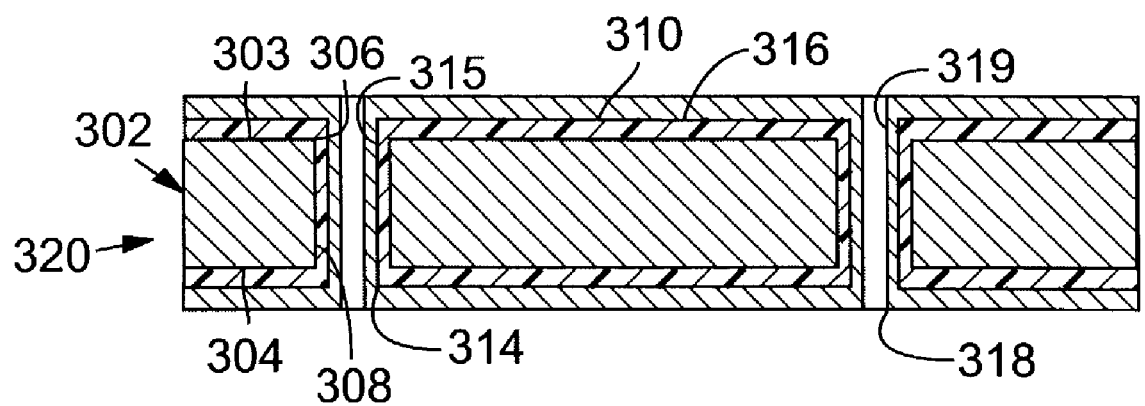
FIG. 5B is a cross-sectional view of a conductive core substrate in accordance with an embodiment of a method of the present invention.

FIGS. 3E and 5B illustrate embodiments of the resulting conductive core substrate 320 having PTH's 318, wherein the laminated and electrophoretically deposited dielectric layer 310 and dielectric liner 312, respectively, is overlaid with a conductive layer 316 and conductive liner 319, respectively, in accordance with aforementioned embodiments. Using the methods as described above in accordance with the present invention, an estimated reduction of 5–7% in the cost to produce a conductive core substrate can be realized. The methods negate the need for the secondary drilling of dielectric plugs to form the PTH's, by providing a self-aligned process for coating the CTH walls with a dielectric liner. By avoiding the problems associated with secondary drilling, the conductive core substrates provided by the methods in accordance with the present invention enables the realization of plated through holes of smaller diameters and lower pitches (below current limit of 450 um).

The methods of the invention are compatible with the existing equipment infrastructure for substrate fabrication and therefore, do not require any major new equipment expenditures.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that only the claims and their equivalents limit this invention.

What is claimed is:

1. A method of making a conductive core substrate, comprising:
   providing a conductive core in the form of a sheet of conductive material having a first side, an opposite second side, and at least one through hole having a through hole wall;
   depositing a dielectric material on the first side, the second side, and each through hole wall without plugging the through hole while depositing the dielectric material;
   forming a dielectric layer on the first and second sides, and forming a dielectric liner completely covering each through hole wall without plugging the through hole while forming the dielectric layer and forming the dielectric liner; and
   depositing a conductive material on each dielectric liner forming a conductive liner defining a plated through hole, the conductive liner insulated from the conductive core by the dielectric liner.

2. The method of claim 1, wherein depositing a dielectric material on the first side, the second side, and the through hole wall without plugging the through hole while depositing the dielectric material and forming a dielectric layer on the first and second sides, and forming a dielectric liner completely covering each through hole wall without plugging the through hole while forming the dielectric layer and forming the dielectric liner comprises:
   covering the first side and each through hole with a laminate of dielectric material without plugging the through hole;
   positioning the first side in an upward orientation while curing the laminate at elevated temperature forming a dielectric layer on the first side, a portion of the laminate flowing into the through holes without plugging the through holes and coating the through hole walls;
   covering the second side and each through hole with a laminate of dielectric material without plugging the through hole; and
   positioning the second side in an upward orientation while curing the laminate at elevated temperature forming a dielectric layer on the second side, a portion of the laminate flowing into each through hole without plugging the through hole forming a dielectric liner completely covering the through hole wall.

3. The method of claim 1, further comprising forming one or more conductive layers on the first and second sides and in electrical communication with predetermined one or more plated through holes.

4. The method of claim 3, wherein forming one or more conductive layers on the first and second sides comprises:
   forming one or more conductive layers on the first and second sides using a process selected from the group consisting of electroless and electrolytic plating, sputter coating, ion deposition, foil lamination, and combinations thereof.

5. The method of claim 3, further comprising:
   depositing additional one or more dielectric and/or conductive layers in an alternating pattern on the first and second sides;
   producing one or more bore holes between one or more conductive layers;
   depositing a conductive material in the bore holes to electrically interconnect one conductive layer to another conductive layer; and
   forming one or more conductive traces on predetermined one or more dielectric layers on the first and second sides and in electrical communication with the conductive material within predetermined one or more bore holes using an additive, semi-additive, or subtractive plating process.

6. The method of claim 3, wherein forming one or more conductive layers on the first and second sides comprises:
   forming one or more conductive traces on the first and second sides forming a circuit pattern.

7. The method of claim 6, wherein forming one or more conductive traces on the first and second sides forming a circuit pattern comprises:
   forming one or more conductive traces on the first and second sides forming a circuit pattern using a process selected from the group consisting of discrete wiring, and subtractive, semi-additive, additive lithographic techniques.

8. A method of making a conductive core substrate, comprising:
   providing a conductive core in the form of a sheet of conductive material having a first side, an opposite second side, and at least one through hole having a through hole wall;
   covering the first side and each through hole with a laminate of dielectric material without plugging the through hole;
   positioning the first side in an upward orientation while curing the laminate at elevated temperature forming a dielectric layer on the first side, a portion of the laminate flowing into the through holes, without plugging the through holes while curing, and coating the through hole walls;
   covering the second side and each through hole with a laminate of dielectric material without plugging the through hole;
   positioning the second side in an upward orientation while curing the laminate at elevated temperature forming a dielectric layer on the second side, a portion of the laminate flowing into each through hole, without plugging the through hole while curing, forming a dielectric liner completely covering the through hole wall; and
   depositing a conductive layer on each dielectric liner forming a plated through hole, the conductive layer insulated from the conductive core by the dielectric liner.

9. The method of claim 8, further comprising forming one or more conductive layers on the first and second sides and in electrical communication with predetermined one or more plated through holes.

10. The method of claim 9, wherein forming one or more conductive layers on the first and second sides comprises:

forming one or more conductive traces on the first and second sides forming a circuit pattern.

11. The method of claim 9, further comprising:

depositing additional one or more dielectric and/or conductive layers in an alternating pattern on the first and second sides;

producing one or more bore holes between one or more conductive layers;

depositing a conductive material in the bore holes to electrically interconnect one conductive layer to another conductive layer; and forming one or more conductive traces on predetermined one or more dielectric layers on the first and second sides and in electrical communication with the conductive material within predetermined one or more bore holes using an additive, semi-additive, or subtractive plating process.

* * * * *